United States Patent
Kim

[19]

[11] Patent Number: 6,104,324
[45] Date of Patent: Aug. 15, 2000

[54] CODING/DECODING METHOD FOR REPRODUCING DATA IN HIGH DENSITY AND REPRODUCING DATA, AND APPARATUS THEREFOR

[75] Inventor: Jin-sook Kim, Yongin, Rep. of Korea

[73] Assignee: Samsung Electronics Co., Ltd., Kyungki-do, Rep. of Korea

[21] Appl. No.: 08/959,928

[22] Filed: Oct. 29, 1997

[30] Foreign Application Priority Data

Oct. 31, 1996 [KR] Rep. of Korea ............... 96-51862

[51] Int. Cl.[7] ............................................ H03M 5/00
[52] U.S. Cl. .............................................. 341/58; 341/59
[58] Field of Search ........................... 341/59, 58, 50, 341/68, 69; 360/32, 48

[56] References Cited

U.S. PATENT DOCUMENTS

| | | | |
|---|---|---|---|
| 5,537,112 | 7/1996 | Tsang | 341/59 |
| 5,731,768 | 3/1998 | Tsang | 341/59 |
| 5,739,779 | 4/1998 | Kunisa et al. | 341/59 |
| 5,774,077 | 6/1998 | Schouhamer Immink | 341/50 |
| 5,859,601 | 1/1999 | Moon et al. | 341/59 |

*Primary Examiner*—Howard L. Williams
*Assistant Examiner*—Peguy JeanPierre
*Attorney, Agent, or Firm*—Eugene M. Lee, Esq.; Kile, McIntyre, Harbin & Lee

[57] ABSTRACT

A coding/decoding method for high density data recording/reproduction, and an encoder/decoder. In the coding method for encoding an 8-bit binary data symbol $X_k$ (k=1, 2, 3, . . . , 8), received from a storage device or a communications channel, into a 9-bit codeword $Y_l$ (l=1, 2, 3, . . . , 9), the number of a maximum transition run (MTR) is limited to a predetermined number, and the number of zero run lengths of the codeword whose MTR is limited is then limited to a predetermined number. Then, a pattern providing a bad effect on detection of a signal is removed from the codeword whose zero run length is limited. In the rate 8/9 modulation code having an MTR of 3, the code rate is high, and the path of the Viterbi detector is reduced as in the rate 2/3 RLL(1,7) code having an MTR of 2, thereby decreasing the delay and complexity of the detector. Also, in order to control the timing and gain control, the k constraint is to 7 such that the signal is easily detected while maintaining self-clocking characteristics of the signal.

7 Claims, 6 Drawing Sheets

MODULATION CODE IN DECIMAL

| | | | | | | | |
|---|---|---|---|---|---|---|---|
| 17 | 58 | 104 | 153 | 198 | 257 | 298 | 342 |
| 18 | 59 | 105 | 154 | 200 | 258 | 299 | 344 |
| 19 | 65 | 106 | 155 | 201 | 259 | 300 | 345 |
| 20 | 66 | 107 | 156 | 202 | 260 | 301 | 346 |
| 21 | 67 | 108 | 157 | 203 | 261 | 302 | 347 |
| 22 | 68 | 109 | 161 | 204 | 262 | 305 | 348 |
| 24 | 69 | 110 | 162 | 205 | 264 | 305 | 349 |
| 25 | 70 | 113 | 163 | 206 | 265 | 307 | 353 |
| 26 | 72 | 114 | 164 | 209 | 266 | 308 | 354 |
| 27 | 73 | 115 | 165 | 210 | 267 | 309 | 355 |
| 28 | 74 | 116 | 166 | 211 | 268 | 310 | 356 |
| 29 | 75 | 117 | 168 | 212 | 269 | 312 | 357 |
| 33 | 76 | 118 | 169 | 213 | 270 | 313 | 358 |
| 34 | 77 | 129 | 170 | 214 | 273 | 314 | 360 |
| 35 | 78 | 130 | 171 | 216 | 274 | 315 | 361 |
| 36 | 81 | 131 | 172 | 217 | 275 | 321 | 362 |
| 37 | 82 | 132 | 173 | 218 | 276 | 322 | 363 |
| 38 | 83 | 133 | 174 | 219 | 277 | 323 | 364 |
| 40 | 84 | 134 | 177 | 220 | 278 | 324 | 365 |
| 41 | 85 | 136 | 178 | 221 | 280 | 325 | 366 |
| 42 | 86 | 137 | 179 | 225 | 281 | 326 | 369 |
| 43 | 88 | 138 | 180 | 226 | 282 | 328 | 370 |
| 44 | 89 | 139 | 181 | 227 | 283 | 329 | 371 |
| 45 | 90 | 140 | 182 | 228 | 284 | 330 | 372 |
| 46 | 91 | 141 | 184 | 229 | 285 | 331 | 373 |
| 49 | 92 | 142 | 185 | 230 | 289 | 332 | 374 |
| 50 | 93 | 145 | 186 | 232 | 290 | 333 | |
| 51 | 97 | 146 | 187 | 233 | 291 | 334 | |
| 52 | 98 | 147 | 193 | 234 | 292 | 337 | |
| 53 | 99 | 148 | 194 | 235 | 293 | 338 | |
| 54 | 100 | 149 | 195 | 236 | 294 | 339 | |
| 56 | 101 | 150 | 196 | 237 | 296 | 340 | |
| 57 | 102 | 152 | 197 | 238 | 297 | 341 | |

FIG. 4A

| INPUT DATA | CODEWORD | INPUT DATA | CODEWORD | INPUT DATA | CODEWORD |
|---|---|---|---|---|---|
| 00000000 | 000110001 | 00100100 | 001000100 | 01001000 | 010001000 |
| 00000001 | 000010001 | 00100101 | 001000101 | 01001001 | 010001001 |
| 00000010 | 000010010 | 00100110 | 001000110 | 01001010 | 010001010 |
| 00000011 | 000010011 | 00100111 | 001010110 | 01001011 | 010001011 |
| 00000100 | 000010100 | 00101000 | 001001000 | 01001100 | 010001100 |
| 00000101 | 000010101 | 00101001 | 001001001 | 01001101 | 010001101 |
| 00000110 | 000010110 | 00101010 | 001001010 | 01001110 | 010001110 |
| 00000111 | 000110010 | 00101011 | 001001011 | 01001111 | 010011101 |
| 00001000 | 000011000 | 00101100 | 001001100 | 01010000 | 010111000 |
| 00001001 | 000011001 | 00101101 | 001001101 | 01010001 | 010100001 |
| 00001010 | 000011010 | 00101110 | 001001110 | 01010010 | 010100010 |
| 00001011 | 000011011 | 00101111 | 001011101 | 01010011 | 010100011 |
| 00001100 | 000011100 | 00110000 | 001110100 | 01010100 | 010100100 |
| 00001101 | 000011101 | 00110001 | 001100001 | 01010101 | 010100101 |
| 00001110 | 000110011 | 00110010 | 001100010 | 01010110 | 010100110 |
| 00001111 | 000110100 | 00110011 | 001100011 | 01010111 | 010110110 |
| 00010000 | 000111000 | 00110100 | 001100100 | 01011000 | 010101000 |
| 00010001 | 000100001 | 00110101 | 001100101 | 01011001 | 010101001 |
| 00010010 | 000100010 | 00110110 | 001100110 | 01011010 | 010101010 |
| 00010011 | 000100011 | 00110111 | 001110110 | 01011011 | 010101011 |
| 00010100 | 000100100 | 00111000 | 001101000 | 01011100 | 010101100 |
| 00010101 | 000100101 | 00111001 | 001101001 | 01011101 | 010101101 |
| 00010110 | 000100110 | 00111010 | 001101010 | 01011110 | 010101110 |
| 00010111 | 000110110 | 00111011 | 001101011 | 01011111 | 010111011 |
| 00011000 | 000101000 | 00111100 | 001101100 | 01100000 | 011011000 |
| 00011001 | 000101001 | 00111101 | 001101101 | 01100001 | 011000001 |
| 00011010 | 000101010 | 00111110 | 001101110 | 01100010 | 011000010 |
| 00011011 | 000101011 | 00111111 | 000110101 | 01100011 | 011000011 |
| 00011100 | 000101100 | 01000000 | 010011000 | 01100100 | 011000100 |
| 00011101 | 000101101 | 01000001 | 010000001 | 01100101 | 011000101 |
| 00011110 | 000101110 | 01000010 | 010000010 | 01100110 | 011000110 |
| 00011111 | 000111011 | 01000011 | 010000011 | 01100111 | 011010110 |
| 00100000 | 001011000 | 01000100 | 010000100 | 01101000 | 011001000 |
| 00100001 | 001000001 | 01000101 | 010000101 | 01101001 | 011001001 |
| 00100010 | 001000010 | 01000110 | 010000110 | 01101010 | 011001010 |
| 00100011 | 001000011 | 01000111 | 010010110 | 01101011 | 011001011 |

FIG. 4B

| INPUT DATA | CODEWORD | INPUT DATA | CODEWORD | INPUT DATA | CODEWORD |
|---|---|---|---|---|---|
| 01101100 | 011001100 | 10010000 | 100111000 | 10110100 | 101100100 |
| 01101101 | 011001101 | 10010001 | 100100001 | 10110101 | 101100101 |
| 01101110 | 011001110 | 10010010 | 100100010 | 10110110 | 101100110 |
| 01101111 | 011011101 | 10010011 | 100100011 | 10110111 | 101110101 |
| 01110000 | 000111001 | 10010100 | 100100100 | 10111000 | 101101000 |
| 01110001 | 011100001 | 10010101 | 100100101 | 10111001 | 101101001 |
| 01110010 | 011100010 | 10010110 | 100100110 | 10111010 | 101101010 |
| 01110011 | 011100011 | 10010111 | 100110110 | 10111011 | 101101011 |
| 01110100 | 011100100 | 10011000 | 100101000 | 10111100 | 101101100 |
| 01110101 | 011100101 | 10011001 | 100101001 | 10111101 | 101101101 |
| 01110110 | 011100110 | 10011010 | 100101010 | 10111110 | 101101110 |
| 01110111 | 000111010 | 10011011 | 100101011 | 10111111 | 001010010 |
| 01111000 | 011101000 | 10011100 | 100101100 | 11000000 | 001010011 |
| 01111001 | 011101001 | 10011011 | 100101101 | 11000001 | 100010001 |
| 01111010 | 011101010 | 10011010 | 100101110 | 11000010 | 100010010 |
| 01111011 | 011101011 | 10011011 | 100111011 | 11000011 | 100010011 |
| 01111100 | 011101100 | 10100000 | 101011000 | 11000100 | 100010100 |
| 01111101 | 011101101 | 10100001 | 101000001 | 11000101 | 100010101 |
| 01111110 | 011101110 | 10100010 | 101000010 | 11000110 | 001010100 |
| 01111111 | 001010001 | 10100011 | 101000011 | 11000111 | 001010101 |
| 10000000 | 100011000 | 10100100 | 101000100 | 11001000 | 001011001 |
| 10000001 | 100000001 | 10100101 | 101000101 | 11001001 | 100011001 |
| 10000010 | 100000010 | 10100110 | 101000110 | 11001010 | 100011010 |
| 10000011 | 100000011 | 10100111 | 101010110 | 11001011 | 100011011 |
| 10000100 | 100000100 | 10101000 | 101001000 | 11001100 | 100011100 |
| 10000101 | 100000101 | 10101001 | 101001001 | 11001101 | 001011010 |
| 10000110 | 100000110 | 10101010 | 101001010 | 11001110 | 001011011 |
| 10000111 | 100010110 | 10101011 | 101001011 | 11001111 | 001011100 |
| 10001000 | 100001000 | 10101100 | 101001100 | 11010000 | 001110001 |
| 10001001 | 100001001 | 10101101 | 101001101 | 11010001 | 100110001 |
| 10001010 | 100001010 | 10101110 | 101001110 | 11010010 | 100110010 |
| 10001011 | 100001011 | 10101111 | 101011101 | 11010011 | 100110011 |
| 10001100 | 100001100 | 10110000 | 101110100 | 11010100 | 100110100 |
| 10001101 | 100001101 | 10110001 | 101100001 | 11010101 | 100110101 |
| 10001110 | 100001110 | 10110010 | 101100010 | 11010110 | 001110010 |
| 10001111 | 100011101 | 10110011 | 101100011 | 11010111 | 001110011 |

FIG. 4C

| INPUT DATA | CODEWORD | INPUT DATA | CODEWORD | INPUT DATA | CODEWORD |
|---|---|---|---|---|---|
| 11011000 | 001110101 | 11100110 | 010011010 | 11110100 | 010110101 |
| 11011001 | 100111001 | 11100111 | 010011011 | 11110101 | 010111001 |
| 11011010 | 100111010 | 11101000 | 010011100 | 11110110 | 010111010 |
| 11011011 | 010010001 | 11101001 | 101011001 | 11110111 | 011010001 |
| 11011100 | 010010010 | 11101010 | 101011010 | 11111000 | 011010010 |
| 11011101 | 010010011 | 11101011 | 101011011 | 11111001 | 011010011 |
| 11011110 | 010010100 | 11101100 | 101011100 | 11111010 | 011010100 |
| 11011111 | 010010101 | 11101101 | 010110001 | 11111011 | 011010101 |
| 11100000 | 010011001 | 11101110 | 010110010 | 11111100 | 011011001 |
| 11100001 | 101010001 | 11101111 | 010110011 | 11111101 | 011011010 |
| 11100010 | 101010010 | 11110000 | 010110100 | 11111110 | 011011011 |
| 11100011 | 101010011 | 11110001 | 101110001 | 11111111 | 011011100 |
| 11100100 | 101010100 | 11110010 | 101110010 | | |
| 11100101 | 101010101 | 11110011 | 101110011 | | |

CODING/DECODING METHOD FOR REPRODUCING DATA IN HIGH DENSITY AND REPRODUCING DATA, AND APPARATUS THEREFOR

BACKGROUND OF THE INVENTION

1. Field of the Invention

The present invention relates a coding/decoding method for recording data in a high-density storage device, and an apparatus therefor, and more particularly, to a coding/decoding method for recording data with high density in a partial response maximum likelihood (PRML) channel, and an apparatus therefor.

2. Description of the Related Art

Currently, due to the increase in the amount of data to a be processed, much higher recording densities are required in storage devices. To achieve this objective, the data to be recorded in the storage device is encoded to increase the recording density and facilitate the detection of a reproduction signal. Also, as the recording density in the storage device increases, large quantities of useful information can be recorded on a storage disk having a predetermined size. Thus, an effective coding method is required such that the recording density is increased and detection of signals is facilitated, by applying less redundancy.

In general, as a useful coding method for a storage device, there is a run length limited (RLL) method satisfying a (d,k) condition. The aim of this coding method is to reduce interference between signals in order to detect a data signal while maintaining a self-clocking characteristic of a data signal. That is, according to the RLL(d,k) coding method, the number of successive "0"s between "1"s is limited to the minimum d and the maximum k. The former d is for facilitating signal detection, and the latter k is for maintaining the timing for restoring a reproduction signal.

As recently used coding methods using the RLL code there is the rate ½(2,7) modulation code, rate 2/3(1,7) modulation code, rate 8/9(0,3) modulation code, rate 8/9(0, 4/4) modulation code and others. According to the rate ½(2,7) modulation code and rate 2/3(1,7) modulation code, "d" is equal to 1 and 2, respectively. Accordingly, interference between signals is decreased while redundancy is high due to the low code rate. Thus, more number of bits must be recorded in order to transmit the same amount of user data, thereby further causing inter-symbol interference (ISI) compared to a code having a high code rate, such as 8/9 RLL (0,3) code or 8/9 RLL(0,4/4) code.

In designing modulation code, it is important to provide a high code rate. The merits of the modulation code having a higher modulation code are that it increases a channel input signal-to-noise ratio (SNR) and there is less redundancy, thereby reducing interference between data for high-density recording.

Generally, when recording or reproducing data in or from a storage device, a channel must be modeled similarly to an actual channel. Channel characteristics of the storage device can be expressed by the following equation (1).

$$(1+D)^n \text{ or } (1-D)(1+D)^n \tag{1}$$

where n=1, . . . , 2.

Partial response maximum likelihood (PRML) pre-codes an input signal to provide controlled ISI between a current data and a previous data, and then modifies the same into the following target response (2), and data is detected using a Viterbi decoder.

$$d_k = a_k + a_{k-1} \text{ or } d_k = a_k - a_{k-2} \tag{2}$$

The PRML method exhibits excellent detecting capacity in a channel in which n=1. As data is recorded in a high density on a storage device, the distance between state transitions is made short, so that the ISI between data becomes serious. In order to reduce the ISI at high density recording, a method for reducing the state transition is provided. In a rate RLL(1,7) code adopting such concept, the coding is performed such that at least one zero exists between symbols. However, even though the rate RLL(1,7) code restricts the state transition, the code rate is low, so that more bits must be recorded compared to the rate RLL(0,3) code or the rate RLL(0,4/4) code having a code rate of 8/9 in order to transmit the same amount of user data, thereby reducing the interval between the recorded data. As a result, interference between data is increased and the merits obtained by restricting the state transition are lost.

When designing modulation codes, the most interesting factor is to provide a high code rate when a user data (binary data symbol) is mapped into a codeword. Such a high code rate is for increasing a channel input signal-to-noise ratio (SNR). Also, a code having a higher code rate reduces the interference between data in contrast to a code having a lower code rate, thereby reducing non-linearity to achieve high density recording.

As a coding method for reducing the ISI, there is a method for increasing the code rate and a method for spacing between the state transitions. However, these two methods are in a trade-off relationship. That is, the interval between the state transitions cannot be at a predetermined level or more without sacrificing the code rate, and it is also difficult to increase the code rate while the interval between the transition states is maintained. The method for reducing the ISI by spacing the state transitions is adopted in the rate 2/3 RLL(1,7) modulation code.

On the other hand, a rate 8/9 RLL(0,3) code and a rate 8/9 RLL(0,4/4) code are designed based on different concepts from the above code. According to these coding methods, the channel input SNR is high due to its high code rate, in contrast to the coding method in which the code rate is low. Also, less data is recorded compared to the coding method in which the code rate is low, in order to record the same amount of user data. Thus, the ISI is reduced, thus lowering the non-linearity.

However, the problem of ISI becomes more serious in the current situation where the recording density in a data storage device gradually increases. To achieve high density recording in a data storage device, the maximum transition run (MTR) code has been introduced. According to the coding method, the coding method for spacing the state transitions by one sample or more at minimum is slightly allowed. That is, the MTR is limited to 2. Also, instead of allowing the MTR, the code rate which influences the channel input SNR is increased. Thus, the MTR coding method is suitable for high density recording on a data storage device.

However, as storage devices require higher recording density, a coding or decoding method for a high-density recording or reproduction is required, in which the ISI is less than the conventional MTR coding method and the code rate affecting the channel input SNR is increased.

SUMMARY OF THE INVENTION

To solve the above problems, it is an object of the present invention to provide a coding method for high density data coding or reproduction, which is suitable for a partial response maximum likelihood (PRML) channel.

It is another object of the present invention to provide a decoding method which is suitable for the coding method.

It is still another object of the present invention to provide an encoder/decoder for the coding/decoding method.

Accordingly, to achieve the first object, there is provided a coding method for encoding an 8-bit binary data symbol $X_k$ (k=1, 2, 3, . . . , 8), received from a storage device or a communications channel, into a 9-bit codeword $Y_l$ (l=1, 2, 3, . . . , 9), the coding method comprising the steps of: (a) limiting the number of a maximum transition run (MTR) to a predetermined number; (b) limiting the number of zero run lengths of the codeword whose MTR is limited in the step (a) to a predetermined number; and (c) mapping the binary data into the codeword which is selected in the steps (a) and (b).

Preferably, in the step (a), the MTR constraint is 3 or less.

Preferably, in the step (b), the zero run lengths constraint is 7 or less at maximum for timing and gain control.

Preferably, the step (c) of mapping the pattern comprises the sub-steps of: (c1) dividing the first 4 bits and the last 4 bits of the 8-bit binary data without a change in state, to correspondence with the first 4 bits and the last 4 bits of the 9-bit codewords; (c2) determining whether the middle bit of the 9-bit codeword is equal to "0"; and (c3) mapping the first 4 bits and the last 4 bits of the 9-bit codeword into 8-bit binary data having the same bit pattern if the middle bit of the 9-bit codeword is determined as "0", and mapping the same into a 9-bit codeword which is most similar to the 8-bit binary data if the middle bit is not equal to "0".

To achieve the second object, there is provided a decoding method for decoding a 9-bit codeword which transmits a predetermined binary symbol and detects a recorded signal in a storage device or a communications channel, into an 8-bit binary data symbol, wherein the 9-bit codeword $Y_l$ (l=1, 2, 3, . . . , 9) is received to decode into the 8-bit binary data symbol $X_k$ (k=1, 2, 3, . . . , 8)

To achieve the third object, there is provided an encoder/decoder comprising: a modulation encoder for modulating and coding an 8-bit binary input data into a 9-bit codeword to be suitable for channel characteristics of a storage device, by a coding method comprising the steps of limiting the number of a maximum transition run (MTR) to 3, limiting the number of zero run lengths of the codeword whose MTR is limited in the previous step to 7, and mapping the binary data into the codeword which is selected in the previous steps; a signal generator for generating a signal from the modulated signal output from the modulator; a write equalizer for pre-compensating the signal output from the signal generator; a read equalizer for processing the signal reproduced from a memory for storing the output signal from the write equalizer, to facilitate detection of the signal; a detector for detecting the signal output from the read equalizer such that the error probability is minimized; and a modulation decoder for grouping the signal output from the detector by a 9-bit codeword and demodulating the group of 9-bit codewords into binary input data.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENT

A modulation code according to the present invention is expressed by two parameters including maximum transition run (MTR) and k. That is, the parameter MTR represents the maximum successive state transitions of a channel output code bit sequence, wherein the MTR of the present invention is equal to 3. The parameter k represents the maximum run lengths of the coded sequence, wherein the k of the present invention is equal to 7. A codeword according to the present invention relates to a partial response maximum likelihood (PRML) code constraint for a digital data magnetic recording on a disk memory device. The code constraint for data to be coded and decoded is applicable to a PR signaling system for the ML detection. In the present invention, the parameters of the modulation code are 8/9 in code rate, 3 in MTR, and 7 in k.

The coding method of the present invention, having a code rate of 8/9 and an MTR of 3, is byte-oriented, and has minimum redundancy, so that the coding method is suitable for a high density storage device. Also, an optimal input and output lookup table for encoding and decoding the rate 8/9 code having an MTR of 3, and a simplified equation for generating codewords are provided.

Figure 1:
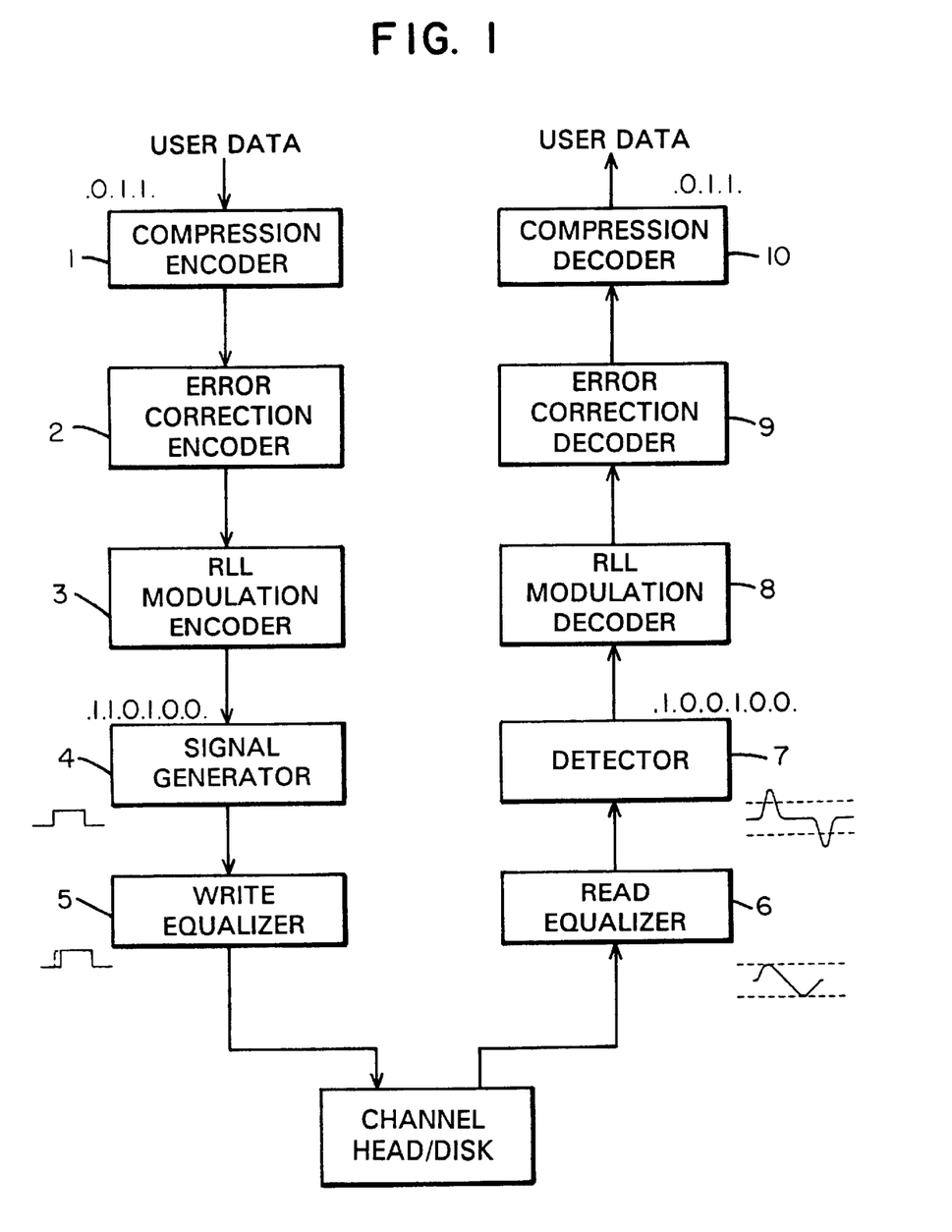
FIG. 1 is a block diagram showing the structure of an encoder/decoder for high density data recording/reproduction.

FIG. 1 is a block diagram showing the structure of an encoder/decoder for high density data coding/reproduction. The operation of the system shown in FIG. 1 is as follows.

A user data to be written on a storage device is protected against noises or other factors causing various kinds of signal distortion via a compression encoder 1 and an error correction encoder 2. Then the signal is coded by a run length limited (RLL) modulation encoder 3 which is suitable for a channel characteristic of the storing apparatus. The modulated data is input to a signal generator 4 to generate a signal, and pre-compensated for by a write equalizer 5 to be written on a head/disk composing a channel. The signal written on the head/disk is reproduced and then processed by a read equalizer 6 such that the signal is easily detected. Then, a signal is detected by a detector 7 to minimize an error probability. The signal detected by the detector 7 is restored into the original user data via an RLL modulation decoder 8 and an error correction decoder 9 and a compression decoder 10.

Figure 2:
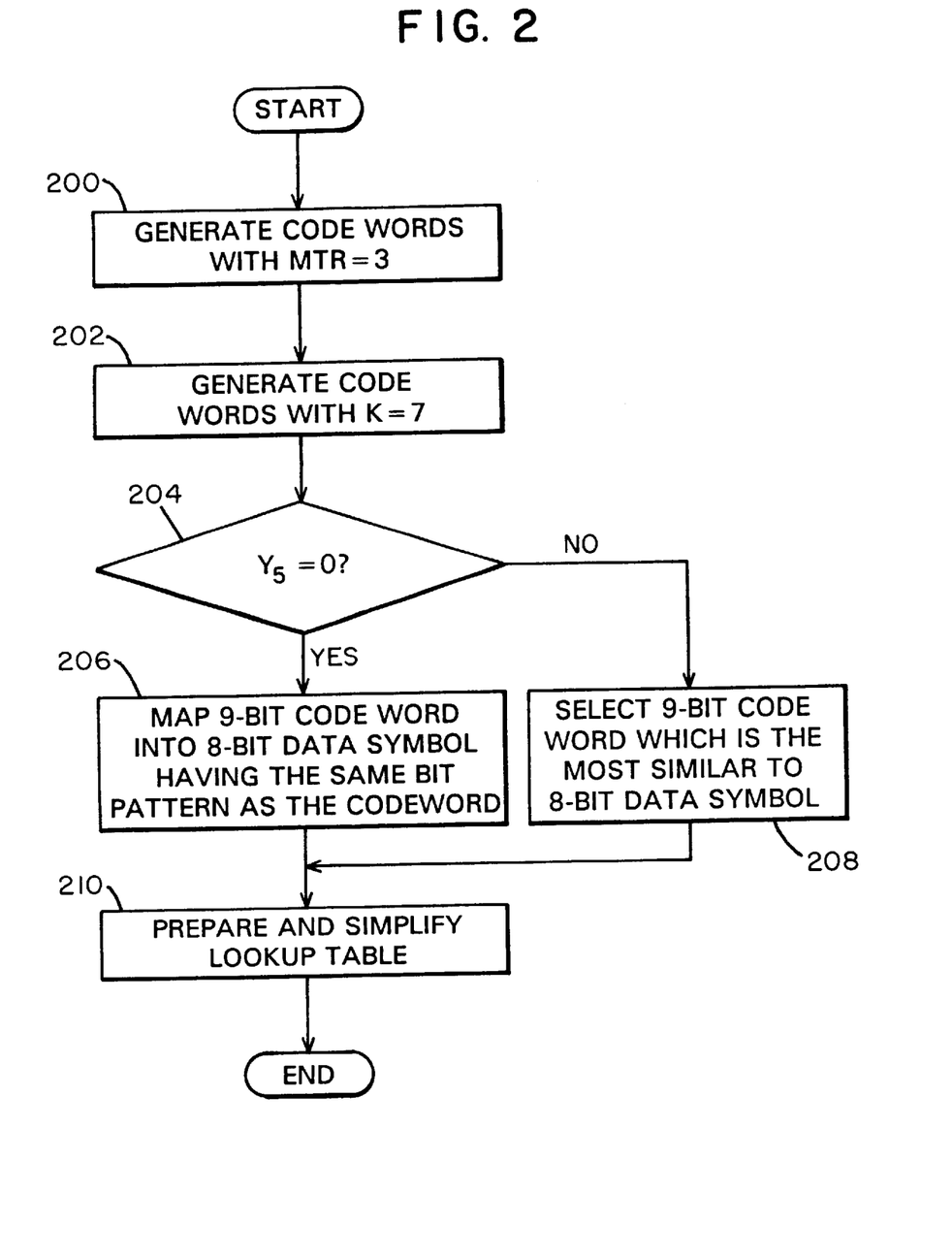
FIG. 2 is a flowchart illustrating a method for generating a rate 8/9 modulation code in which the MTR is 3 and k is 7 according to the present invention.

FIG. 2 is a flowchart illustrating a coding method according to the present invention, for generating codeword in which the MTR constraint is 3 or less and the k is equal to 7.

In a data storage device, when the MTR is equal to 2, the ISI is greatly affected. However, the coding method of the present invention adopts a higher code rate than the conventional method, which affects a channel input SNR, instead of allowing an MTR of 3 which is given less weight than an MTR of 2. The modulation code of the present invention, having a high code rate of 8/9 and an MTR of 3, reduces the path of the Viterbi detector like the rate 2/3 RLL(1,7) modulation code having an MTR of 2, thereby reducing the delay and complexity of the detector. Also, for the timing and gain control, the k is set to 7 such that signal detection is facilitated while maintaining self-clocking characteristics of the signal.

Referring to FIG. 2, the coding method according to the present invention will be described.

First, a codeword satisfying the condition of MTR is generated (step 200). Here, the code rate 8/9 modulation code having an MTR of 3 and a k of 7 provides 257 codewords such that 8-bit binary data symbols correspond one-to-one to 9-bit codewords. Thus, all 8-bit binary data symbols can be encoded to 9-bit codewords, and decoding from 9-bit codewords can be achieved.

According to the present invention, a special method for specifying the correspondence between 8-bit binary data symbols and the 9-bit codewords is introduced to maintain a read backward symmetry, and the 9-bit codeword has a similar structure to the 8-bit data through a partition. Here, the partition is for simplifying the overall one-to-one correspondence between the 8-bit binary data and the 9-bit codewords, thereby reducing the complexity of the encoder/decoder. That is, if the middle bit, i.e., the fifth bit position of the 9-bit codeword in this partition, is 1, the partition of codeword assignments includes the set of data bytes in which the first and last bits of the 8-bit data bytes can be mapped without change into the first and last four bits, respectively, of the 9-bit codeword. Otherwise, the 9-bit codeword is mapped into 8-bit data as FIG. 4. Here, assuming that Y is a 9-bit codeword in which MTR=3 and k=7, the Y is expressed by the following equation (3).

$$Y=[Y_1, Y_2, Y_3, Y_4, Y_5, Y_6, Y_7, Y_8, Y_9] \quad (3)$$

Here, a group of codewords satisfying the condition of the 8/9 of code rate and an MTR of 3 can be obtained by removing a 9-bit sequence having an MTR of 2 or more at the left end of the codeword, an MTR of 3 or more at the right end, or an MTR of 4 or more in the middle of the codeword, from the overall coded sequences. Here, such constraint of MTR=3 is given from the boolean relationship of the following formula (4).

$$(\overline{Y_1, Y_2})(\overline{Y_1, Y_2, Y_3, Y_4})$$

$$(\overline{Y_2, Y_3, Y_4, Y_5}) \ (\overline{Y_3, Y_4, Y_5, Y_6})$$

$$(\overline{Y_4, Y_5, Y_6, Y_7}) \ (\overline{Y_5, Y_6, Y_7, Y_8})$$

$$(\overline{Y_6, Y_7, Y_8, Y_9}) \ (\overline{Y_7, Y_8, Y_9})=1 \quad (4)$$

Then, a codeword satisfying the condition where k=7 is generated (step 202). Here, k is constrained by removing codewords having 5 or more zero run lengths at the left end, or 4 or more zero run lengths at the right end, or 8 or more zero run lengths in the middle of the 9-bit codeword, from all sequences. Such k constraint is expressed by the following formula (5).

$$(\overline{Y_1, Y_2, Y_3, Y_4, Y_5}) \ (\overline{Y_6, Y_7, Y_8, Y_9})=1 \quad (5)$$

There are 293 significant 9-bit codewords satisfying the formula (4). Also, the number of 9-bit codewords satisfying both formulas (3) and (4) is 257. Thus, only one extra codeword exists, thereby increasing the efficiency. This extra codeword is used to remove an undesired codeword pattern and to detect an error, and for other special purposes.

Then, it is determined whether the fifth bit value $Y_5$ is equal to "0" (step 204). Here, in order to provide regularity between the 9-bit codewords and the input 8-bit binary data symbols, a method of partitioning is used. First, the first 4 bits and the last 4 bits of the 8-bit binary data are mapped into the first 4 bits and the last 4 bits of the 9-bit codeword without any changes. In this partition, if the middle bit of the 9-bit codeword, that is, the fifth bit, is "0", 9-bit codewords which satisfy the formulas (4) and (5) and have a middle bit of 0 are mapped into 8-bit binary data symbols having the same data bit pattern as that of the 9-bit codeword from which the middle bit is eliminated (step 206). The number of pairs of the 8-bit binary data symbol and 9-bit codeword, divided by the method of partition using the symmetry between the 8-bit binary data symbol and 9-bit codeword, totals 143.

However, if the fifth bit is not equal to "0" in step 204, a 9-bit codeword which is most similar to the 8-bit binary data symbol is selected (step 208). That is, in step 208, the remaining 8-bit binary data symbols which are eliminated from mapping due to the result of the step 204 are mapped into the 9-bit codeword. That is, among the 9-bit codewords having a middle bit of "1", which remains by subtracting 143 of the pairs of data symbols and codewords from 257 total codewords, a 9-bit codeword which is most similar to the 8-bit binary data symbol is selected in order to reduce the complexity of the encoder and decoder.

The 9-bit codeword most similar to the 8-bit input data can be determined using techniques that are known to one skilled in the art. One such exemplary technique is to determine the 9-bit codeword most similar to the 8-bit input data using the Weighted Hamming Distance (WHD) technique. The WHD determines similarity between two bit patterns, that is, a hamming distance is calculated by placing different weights to each bit.

For example, the weighted hamming distance (WHD) between data A of a8–a1 and data B of b8–b1 is obtained as follows.

$$WHD=2^7(a8-b8)+2^6(a7-b7)+2^5(a6-b6)+2^4(a5-b5)+2^3(a4-b4)+2^3(a3-b3)+2^1(a2-b2)+2^0(a1-b1)$$

When the 8-bit input data is assumed to be x8–x1 in the present application, the WHD between the input data, x8–x1, and y9, y8, y7, y6, y4, y3, y2 and y1, of the 9-bit sequences of which the intermediate bit y5 is "1" where the intermediate bit y5 is excluded, is obtained from the following equation.

$$WHD=2^7(x8-y9)+2^6(x7-y8)+2^5(x6-y7)+2^4(x5-y6)+2^3(x4-y4)+2^2(x3-y3)+2^1(x2-y2)+2^0(x1-y1)$$

That is, in mapping the 8-bit input data and the 9-bit sequences of which the intermediate bit y5 is "1", the 9-bit sequences of y9, y8, y7, y6, y4, y3, y2 and y1, excluding the intermediate y5, are compared with the 8-bit input data so that the 9-bit sequence having the least WHD is mapped into the 8-bit input data.

Then, a lookup table defining input and output relationships is prepared and simplified by the Karnough map (step 212).

Figure 3:
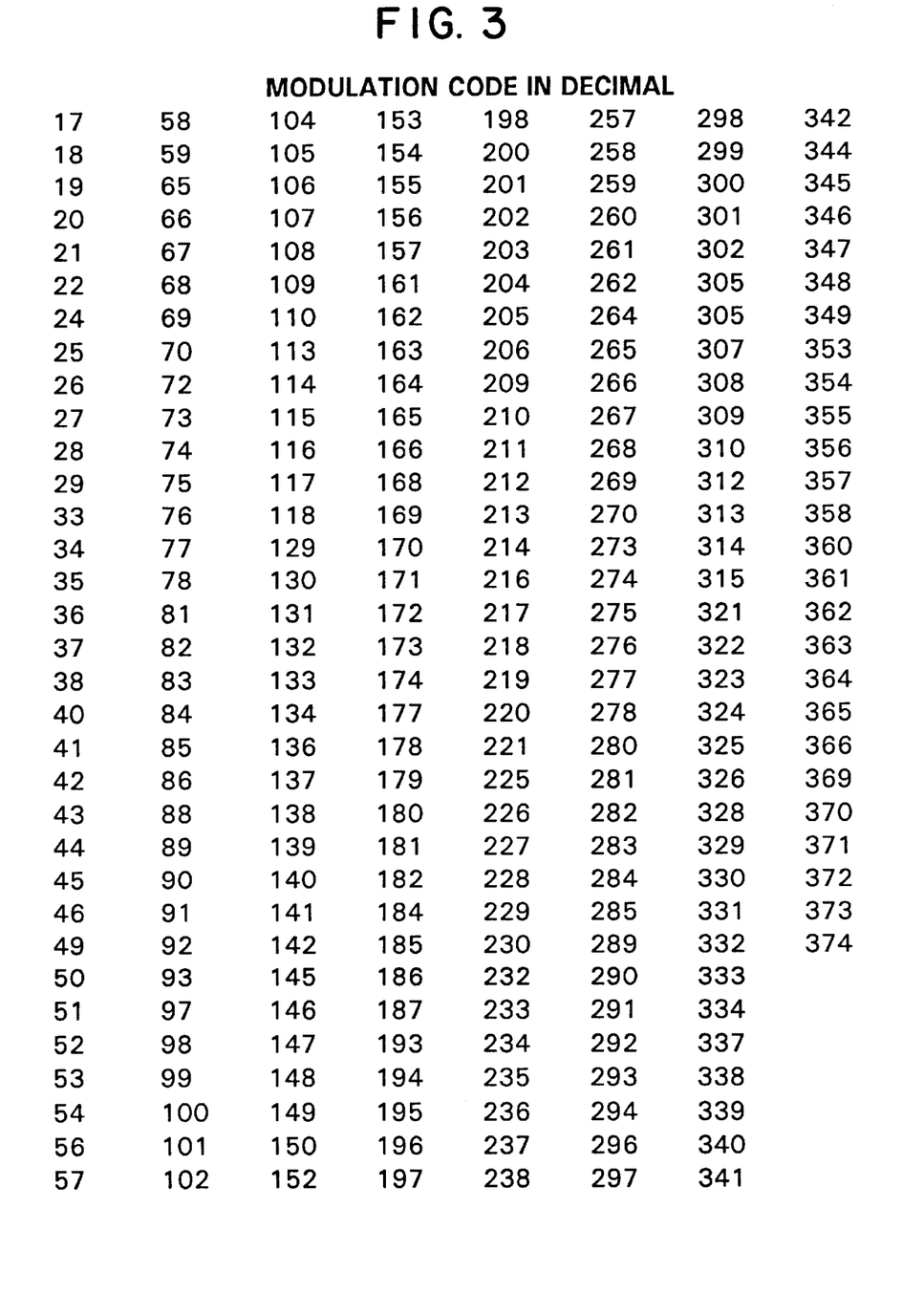
FIG. 3 is a table in which the modulation code from the flowchart of FIG. 2 is expressed in decimal form.

FIG. 3 is a table in which the modulation code from the flowchart of FIG. 2 is expressed in decimal form.

Figure 4A:
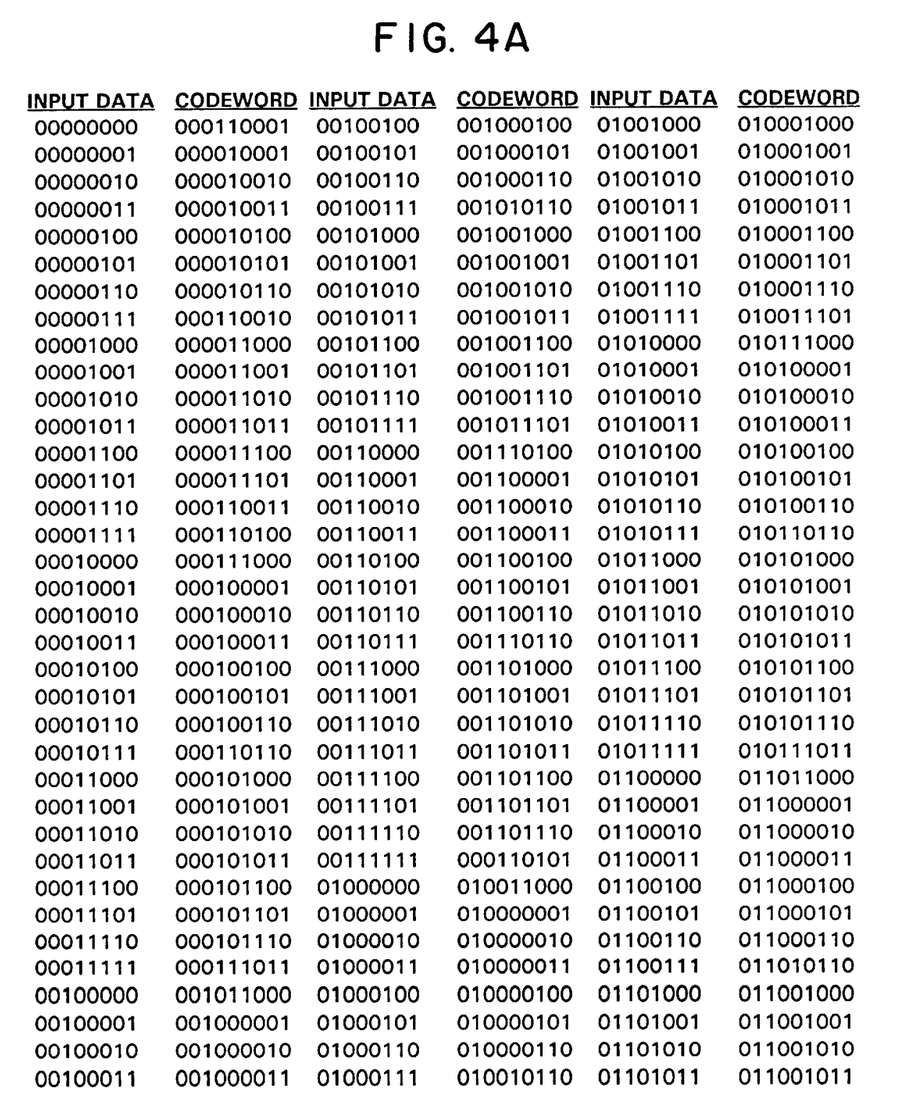
FIGS. 4A–4C show a lookup table defining the relationship between an input 8-bit data symbol and an output 9-bit codeword.
Figure 4B:
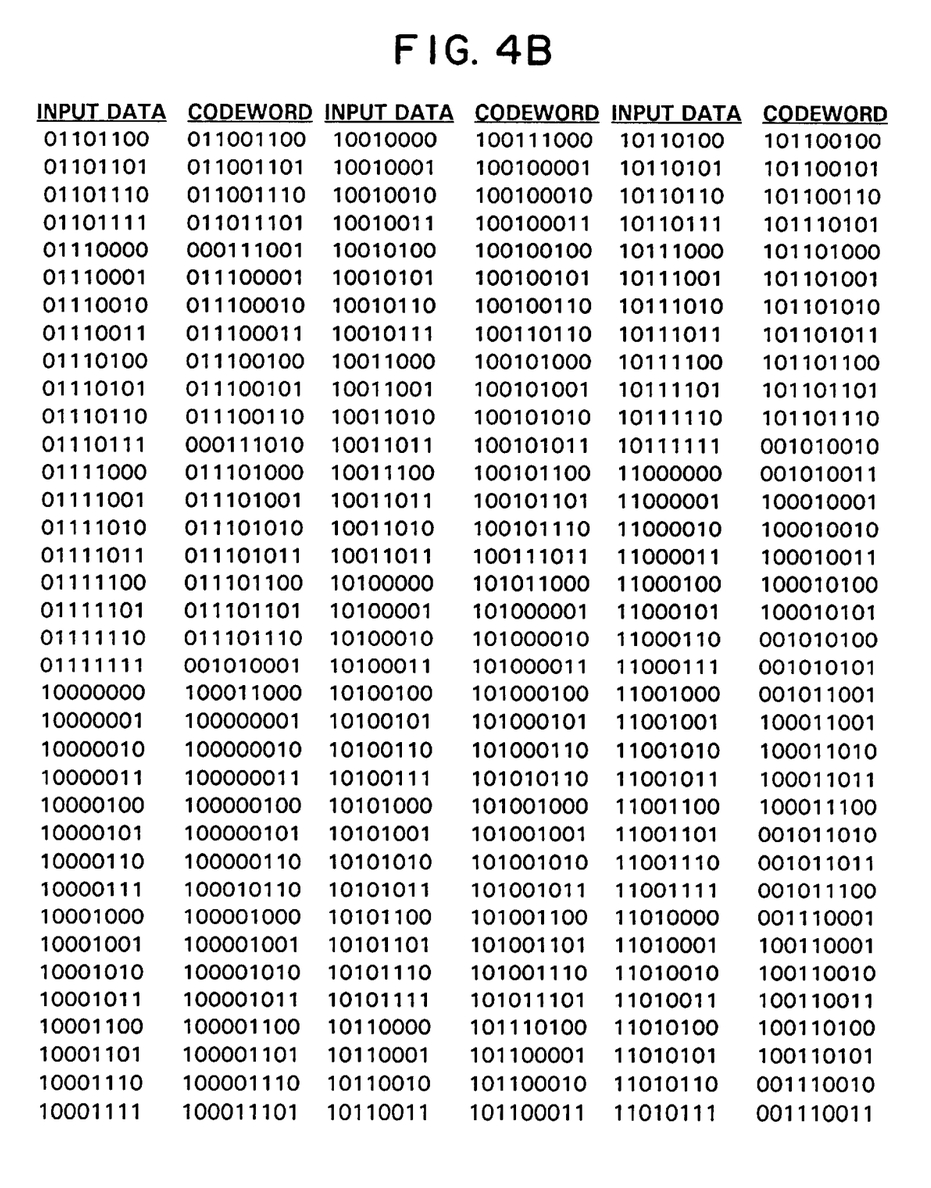
Figure 4C:
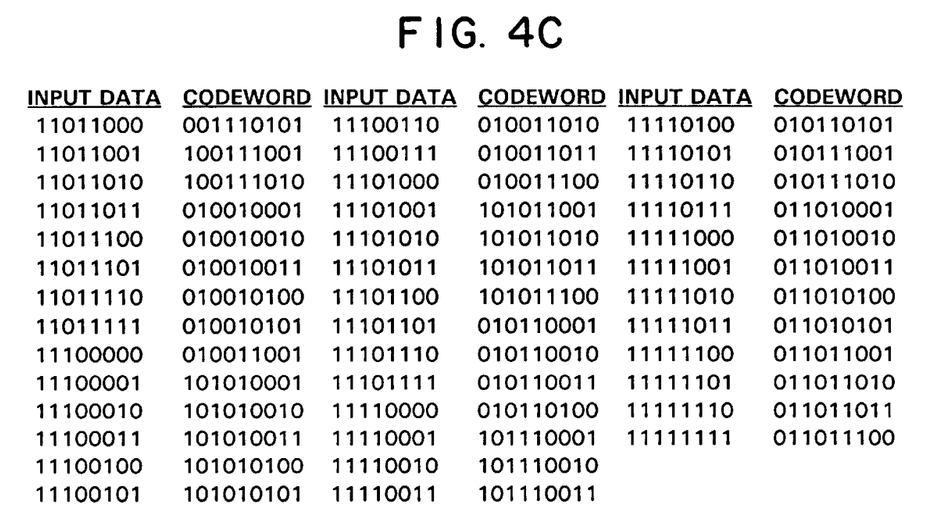

FIGS. 4A–4C show a lookup table defining the relationship between an input 8-bit data symbol and an output 9-bit codeword.

The modulation code generated by the coding method of the present invention provides frequent non-zero samples, thereby improving the timing of the channel and the performance of a gain control circuit. Also, the number of paths for detection by the Viterbi detector is reduced, thereby limiting the complexity of the ML detector.

In the rate 8/9 modulation code having an MTR of 3 according to the present invention, the code rate is high, and the path of the Viterbi detector is reduced as in the rate 2/3 RLL(1,7) code having an MTR of 2, thereby decreasing the delay and complexity of the detector. Also, in order to control the timing and gain control, k is constrained to 7 such that the signal is easily detected while maintaining the self-clocking characteristics of the signal.

What is claimed is:

1. A coding method for encoding an 8-bit binary data symbol $X_k$ (k=1, 2, 3, . . . , 8), received from a storage device or a communications channel, into a 9-bit codeword $Y_l$ (l=1, 2, 3, . . . , 9), the coding method comprising the steps of:

(a) limiting the number of a maximum transition run (MTR) to a first predetermined number;

(b) limiting the number of zero run lengths of the codeword whose MTR is limited in the step (a) to a second predetermined number; and (c) mapping the binary data into the codeword which is selected in the steps (a) and (b), wherein the step (c) of mapping the pattern comprises the sub-steps of:

(c1) dividing the first 4 bits and the last 4 bits of the 8-bit binary data to correspond to the first 4 bits and the last 4 bits of the 9-bit codeword;

(c2) determining whether the middle bit of the 9-bit codeword is equal to "0"; and (c3) mapping the first 4 bits and the last 4 bits of the 9-bit codeword into 8-bit binary data having the same bit pattern if the middle bit of the 9-bit codeword is determined as "0", and mapping the same into a 9-bit codeword which is most similar to the 8-bit binary data if the middle bit is not equal to "0".

2. The coding method of claim 1, wherein in the step (a), the MTR constraint is 3 or less.

3. The coding method of claim 1, wherein in the step (b), the zero run lengths constraint is 7 or less at maximum for timing and gain control.

4. A coding/decoding method for encoding/decoding an 8-bit binary data symbol $X_k$ (k=1, 2, 3, . . . , 8), received from a storage device or a communications channel, into/from a 9-bit codeword $Y_l$ (l=1, 2, 3, . . . , 9), the coding method comprising the steps of:

(a) limiting the number of a maximum transition run (MTR) to a first predetermined number;

(b) limiting the number of zero run lengths of the codeword whose MTR is limited in the step (a) to a second predetermined number; and (c) mapping the binary data into the codeword which is selected in the steps (a) and (b), wherein the step (c) of mapping the pattern comprises the sub-steps of:

(c1) dividing the first 4 bits and the last 4 bits of the 8-bit binary data to correspond to the first 4 bits and the last 4 bits of the 9-bit codeword;

(c2) determining whether the middle bit of the 9-bit codeword is equal to "0"; and (c3) mapping the first 4 bits and the last 4 bits of the 9-bit codeword into 8-bit binary data having the same bit pattern if the middle bit of the 9-bit codeword is determined as "0", and mapping the same into a 9-bit codeword which is most similar to the 8-bit binary data if the middle bit is not equal to "0", the decoding method including the step of decoding the 9-bit codeword $Y_l$ (l=1, 2, 3, . . . , 9), into the 8-bit binary data symbol $X_k$ (k=1, 2, 3, . . . , 8).

5. An encoder/decoder comprising:

a modulation encoder for modulating and coding an 8-bit binary input data into a 9-bit codeword suitable for channel characteristics of a storage device, by a coding method comprising the steps of limiting the number of a maximum transition run (MTR) to 3, limiting the number of zero run lengths of the codeword whose MTR is limited in the previous step to 7, and mapping the binary data into the codeword which is selected in the previous steps by the following sub-steps:

(c1) dividing the first 4 bits and the last 4 bits of the 8-bit binary data to correspond to the first 4 bits and the last 4 bits of the 9-bit codeword;

(c2) determining whether the middle bit of the 9-bit codeword is equal to "0"; and (c3) mapping the first 4 bits and the last 4 bits of the 9-bit codeword into 8-bit binary data having the same bit pattern if the middle bit of the 9-bit codeword is determined as "0", and mapping the same into a 9-bit codeword which is most similar to the 8-bit binary data if the middle bit is not equal to "0";

a signal generator for generating a signal from the modulated signal output from the modulation encoder;

a write equalizer for pre-compensating the signal output from the signal generator;

a read equalizer for processing the signal reproduced from a memory for storing the output signal from the write equalizer, to facilitate detection of the signal;

a detector for detecting the signal output from the read equalizer such that the error probability is minimized; and a modulation decoder for grouping the signal output from the detector by a 9-bit codeword and demodulating the group of 9-bit codewords into 8-bit binary data.

6. A method for selecting a 9-bit codeword for an 8/9 code rate, said method comprising the steps of:

(a) when a 9-bit sequence is depicted as Y=(Y1, Y2, Y3, Y4, Y5, Y6, Y7, Y8, Y9), selecting 9-bit sequences satisfying the below equation among $2_8$ (=512) 9-bit sequences, $$(\overline{Y}_1,\overline{Y}_2)(\overline{Y}_1,\overline{Y}_2,\overline{Y}_3,\overline{Y}_4)$$

$$(\overline{Y}_2,\overline{Y}_3,\overline{Y}_4,\overline{Y}_5)\ (\overline{Y}_3,\overline{Y}_4,\overline{Y}_5,\overline{Y}_6)$$

$$(\overline{Y}_4,\overline{Y}_5,\overline{Y}_6,\overline{Y}_7)\ (\overline{Y}_5,\overline{Y}_6,\overline{Y}_7,\overline{Y}_8)$$

$$(\overline{Y}_6,\overline{Y}_7,\overline{Y}_8,\overline{Y}_9)\ (\overline{Y}_7,\overline{Y}_8,\overline{Y}_9)=1;$$

and (b) extracting sequences satisfying the below equation from the 9-bit sequences selected in said step (a), $$(\overline{Y}_1,\overline{Y}_2,\overline{Y}_3,\overline{Y}_4,\overline{Y}_5)\ (\overline{Y}_6,\overline{Y}_7,\overline{Y}_8,\overline{Y}_9)=1,$$

wherein a 9-bit codeword satisfying the conditions that MTR is equal to or less than 3 and k is equal to or less than 7 is selected among $2^9$ (=512) 9-bit sequences.

7. A method for mapping $2^8$ (=256) 8-bit input data and 256 or more 9-bit sequences, said method comprising the steps of:

(a) classifying said 9-bit sequences into two groups according to a bit value (0 or 1) at a middle position of said 9-bit sequences;

(b) mapping the 9-bit sequences belonging to one group and the 8-bit input data having the same bit pattern as the bit pattern excluding the bit which is the reference in the classification in step (a); and (c) mapping the 9-bit sequences belonging to the other group and the 8-bit input data having a bit pattern similar to the bit pattern excluding the bit which is the reference in the classification in step (a).

* * * * *